United States Patent [19]
Parkinson et al.

[11] Patent Number: 5,907,512
[45] Date of Patent: May 25, 1999

[54] MASK WRITE ENABLEMENT FOR MEMORY DEVICES WHICH PERMITS SELECTIVE MASKED ENABLEMENT OF PLURAL SEGMENTS

[75] Inventors: Ward D. Parkinson; Jeffrey S. Mailloux; Eugene H. Cloud, all of Boise, Id.

[73] Assignee: Micron Technology, Inc., Boise, Id.

[21] Appl. No.: 08/140,365

[22] Filed: Oct. 20, 1993

Related U.S. Application Data

[63] Continuation of application No. 07/697,844, May 9, 1991, abandoned, which is a continuation-in-part of application No. 07/393,878, Aug. 14, 1989, abandoned.

[51] Int. Cl.$^6$ ....................................................... G11C 7/00
[52] U.S. Cl. ............................ 365/195; 365/193; 365/51
[58] Field of Search ......................... 395/427; 365/195, 365/238.5, 193; 711/100, 105

[56] References Cited

U.S. PATENT DOCUMENTS

| | | | |
|---|---|---|---|
| 4,636,986 | 1/1987 | Pinkham | 365/195 |
| 4,653,030 | 3/1987 | Tachibana et al. | 365/222 |
| 4,656,605 | 4/1987 | Clayton | 365/52 |
| 4,683,555 | 7/1987 | Pinkham | 365/189.02 |
| 4,758,992 | 7/1988 | Taguchi | 365/222 |
| 4,888,773 | 12/1989 | Arlington et al. | 365/189.02 |
| 5,012,472 | 4/1991 | Arimoto et al. | 371/40.1 |
| 5,142,637 | 8/1992 | Harlin et al. | 395/425 |
| 5,148,523 | 9/1992 | Harlin et al. | 395/425 |
| 5,148,524 | 9/1992 | Harlin et al. | 395/166 |
| 5,159,676 | 10/1992 | Wicklund et al. | 395/425 |
| 5,175,835 | 12/1992 | Beighe et al. | 395/421.01 |
| 5,329,629 | 7/1994 | Horst et al. | 395/405 |

OTHER PUBLICATIONS

Micron Technology, *JEDEC Write–Per–Bit DRAM Module Proposal*, Sep. 6, 1988, six pages.

*Primary Examiner*—David L. Robertson
*Attorney, Agent, or Firm*—Fletcher, Yoder & Van Someren

[57] ABSTRACT

A Mask Write mode for a semiconductor memory responds to an enable command. This permits a by-four chip to provide parity information for four sectors of memory. The invention allows the latching of mask data on a rising edge of CAS so that new mask data can be entered in Page Mode.

15 Claims, 4 Drawing Sheets

MASK WRITE ENABLEMENT FOR MEMORY DEVICES WHICH PERMITS SELECTIVE MASKED ENABLEMENT OF PLURAL SEGMENTS

CROSS-REFERENCE TO RELATED APPLICATION

This application is a continuation to U.S. patent application Ser. No. 07/697,844, filed May 9, 1991, now abandoned, which is a continuation-in-part to U.S. patent application Ser. No. 07/393,878, filed Aug. 14, 1989.

BACKGROUND OF THE INVENTION

1. Field of the Invention

This invention relates to circuitry for controlling semiconductor devices. More specifically it relates to memory addressing systems for semiconductor memory arrays. It is particularly directed to providing address read/write enablement for semiconductors. The address enablement is used in addressing different semiconductor memory chips in a memory array which is connected to a computer CPU (central processing unit) through a multi-line bus.

2. Description of the Related Art

This invention is intended for use in controlling semiconductor devices, where each semiconductor device has an array of addressable circuits thereon. Such arrays are found on memory circuits, typical memory circuits being dynamic random access memories (DRAMs).

The invention uses various materials which are electrically either conductive, insulating or semiconducting, although the completed semiconductor circuit device itself is usually referred to as a "semiconductor". The invention refers to a method of controlling addressed devices, and is not restricted to implementations which involve memory devices or semiconductor devices.

Computer systems, whether general purpose, desktop, work stations, or imbedded controllers (e.g., small computers used to control tools, instruments, or appliances), all include some form of read/write memory. At the present time, the most popular form of read/write memory is the semiconductor DRAM (or Dynamic Random Access Memory) The DRAM is so popular because it offers the best available combination of performance, density, and price; but it does have some disadvantages. Since its memory is based on the storage of an electrical charge on a small capacitor, the charge on the capacitor must be periodically renewed to prevent it from "forgetting" (this process of renewing the charge is called refresh). Internally, the memory cells are organized into a rectangular array where each cell is addressed as being in a particular row, and at a particular column location within the row.

The most common DRAMs minimize the package size by using the same input pins to select the row and the column, i.e., multiplexing the addresses. To read (or write) to a particular cell, the row address is presented on the address pins and a control signal (called RAS) is taken low; then the column address is presented on the same address pins and while RAS is kept low, another control signal (called CAS) is taken low. When RAS first goes low, sensing circuits within the memory device measure the charge on the capacitors for every cell that is a part of the specified row. When CAS goes low, the resulting data from the cells within that row as specified by the column address is transferred to the output pin(s). The time from RAS going low until data is available at the output (for a read operation) is called the "row access time" and is typically 100–120 ns. The time from CAS going low until data is available is approximately half of the row access time and is called the "column access time" (some DRAM manufacturers measure column access time from the time the column address is put onto the address pins instead of when CAS goes low).

The maximum operating speed of a computer device depends on two things: how fast the processor can execute instructions, and how long it has to wait for instructions or data. The maximum operating rate will occur when the read/write memory is sufficiently fast so that the processor never has to wait for instructions or data. This is referred to as "operating with zero wait states". Since many of the most common processors require memory accesses of under 100 ns (commonly 50–60 ns), using a DRAM memory with full RAS/CAS cycles would require slowing down the processor by adding "wait states". To operate without wait states either requires a faster read/write memory device or some means must be found to speed up the DRAM memory. One memory device that can be used is the SRAM (Static Random Access Memory), which has access times as quick as one-tenth that of a DRAM. However, that faster access time comes at the expense of a more complex device which means that it costs more and is less dense than the DRAM.

Several different modifications to the DRAM have been devised to reduce the access time. The most common modification for general read/write applications is the "page mode". In the page mode, once RAS has been taken low (which effectively remembers the row address), any cell on that row (referred to as that "page") can be accessed by presenting its column address and taking CAS low. If RAS is kept low, CAS can be taken high, another column address presented and CAS taken low again to access another cell within the page. This process of presenting a new column address and taking CAS low can be repeated several times; and in each case the access time from the new column address to data is now the column access time instead of the longer row access time and is typically less than 60 ns.

The logic required to use the DRAM parts in this manner is fairly complex. There is a limit to how long RAS can be held low without taking it back high. Also, DRAMs need to be refreshed at regular intervals, so the page mode may need to be interrupted to perform a refresh cycle. For the second, and following page mode cycles, it is necessary to compare the current row address with the previous address to determine if it is the same; if not, then a penalty is imposed because RAS has to be taken high for a specified period of time (about 100 ns) before the new row address can be input. After RAS goes back low, then the column address can be presented and CAS taken low just as previously described for a normal access. That means that if the new request is in a different row, that access will actually be slower than for a standard DRAM access. Therefore, an optimal controller for page mode operation of main DRAM memory would include some means of automatically switching between page mode and non-page mode of DRAM operation depending on some prediction of whether the next access will be on the same page or on another page.

A DRAM controller can operate DRAMs in a page mode of operation by holding RAS low. As mentioned, this reduces access time for successive memory accesses, but only if those accesses are, in fact, addressed on the same page of the DRAM. If the access time in normal mode is 120 ns, then page mode access time would be in the range of approximately 50 or 60 ns. If the address turns out to be on a different page, then RAS must be sequenced, followed by CAS, which is now delayed. Consequently, a "miss", where a sequential memory address is not in the same row, results in increased access time, which would be, for example, in the range of 220 ns. For this reason, it is advantageous for a page mode controller to be "clairvoyant" in predicting when sequential addresses will be on the same page of a DRAM.

Computers have been designed with architectures which permit a central processor to respond to an initial set of instructions, called BIOS, followed by Instructions from an operating program (operating system software), followed by further programming information embodied by the particular program being run. Various forms of memory are addressed through this architecture.

Most computers divide their memory into blocks. Thus, an initial block, such as 512 bytes, can have one set of control parameters, and further blocks can have different control parameters. Typically, an initial block, such as the above mentioned 512 bytes, will have faster response times. This initial block is sometimes SRAM, with the remaining memory being DRAM.

Blocks of memory are often divided into byte multiples of chip sizes. For example, 4 Meg chips are grouped together in groups of 9 to provide 4 megabytes of 9 bit bytes.

Parity bits are commonly used with some computer protocols, and are found on most DOS compatible computers. The parity bit is added to 8 bit bytes as a ninth bit. The byte is able to contain 8 bits of program data, but, with the parity bit, requires 9 bits of memory per byte. 16 and 32 bit computer memory in a similarly structured system therefore require 18 and 36 bits, respectively. A computer could also be configured to use one parity per 16 and 32 bits of computer memory, so that such a 16 or 32 bit system would require 17 and 33 bits, respectively.

Smaller blocks of memory often use "by-four" chips, such as 1 Meg "by-four" chips. These are 4 Meg chips which are configured to behave as four 1 Meg chips. Odd bits (such as ninth parity bits) use a "by-one" 1 Meg chip, which is an ordinary 1 Meg chip configured to behave as a single 1 Meg chip. Thus, two generations of chips are blocked together.

For example, in one configuration, four 64K "by-four" chips are grouped together, along with two 64K "by-one" chips. The 64K "by-four" chips are essentially 256K chips, so that four of these are grouped with the two 64K chips. This gives a number of nine bit bytes of memory equal to twice the bit size of one of the sectors, or 128K, because there are eighteen sectors in that configuration.

In one configuration, shown in FIG. 4, eight "by-four" chips 41 are grouped together on a memory module, along with four "by-one" chips 43. The module may then be addressed as four 9 bit bytes, two 18 bit words, or one 36 bit word. The four parity bits are each used to check parity in each of the eight bit bytes. Of course, the total memory on the module is equal to the total number of bits divided by the number of bits per byte.

Certain chip configurations, such as a 256K×36 module, are organized into multiple blocks of memory. It is desired to implement parity memory, but byte addressability with parity becomes difficult where multiple parity bits are to be simultaneously addressed from the same chip.

In order to implement parity memory on a 256K×36 module, a processor should be able to only change some combination of blocks within the 36 bit word. This feature is called "byte addressability".

In order to provide "byte addressability" with parity, it is necessary to use two 256K×4 DRAMs and one 256K×1 DRAM to make up each of the 9 bit wide blocks. So the complete module tales eight 256K×4's and four 256K×1's. There are many disadvantages to using "mixed densities" of DRAMs to build this module. Some of these are: the speed differences, the module's requirement of continued availability of older DRAMs, and the profuse number of parts.

The parity bits were not all put into one 256K×4 part because there must be individual write control on each of the four bits. Individual write control on each of the four bits is not possible when all four bits reside inside one "normal" DRAM.

In normal Mask Write cycles, the mask data is latched on the falling edge of RAS and cannot be changed in a Page Mode cycle. It would be desirable to have a method of latching mask data on the rising edge of CAS so that new mask data can be entered in Page Mode.

Standardized operating programs, such as MS DOS or OS 2 (trademarks of Microsoft Corporation), permit computers from different manufacturers to behave similarly, a fact that is not lost to software developers who design their programs to operate from the operating system ("DOS") instead of directly from the computer's BIOS. These circumstances provide what is often referred to as DOS compatible computers. These are colloquially referred to as IBM compatible computers, even though specific architectures of the computers differ.

Most DOS compatible computers use the same set of bus addresses for addressing similar memory locations. This enables software developers to write programs which function on different computers.

While DOS compatible computers have used eight bit bytes (nine with parity), never generations of computers are using more bits per bytes, such as 32 bits (36 with parity). The never generations of computers often must accept parity in memory for the larger (32 bit) bytes and for each of the smaller (eight bit) bytes if the computer is to be able to divide memory into the smaller bytes.

A video RAM (VRAM), sometimes called dual-port RAN, is a DRAM (dynamic random access memory) with a serial access memory. The serial access memory permits a block of stored data to be rapidly accessed, while the normal access function of the DRAM is also occurring. The information in the serial access memory is normally obtained from, or input into, a primary memory on the VRAM. The primary memory is configured as a DRAM and is accessed according to DRAM protocols.

It is further desired to enhance the address ability of VRAM devices in order to facilitate computer access to the VRAM with a reduced number of address lines.

A common feature that has recently been added to the x4 and x8 organizations of both DRAMs and VRAMs is the Mask Write (or write-per-bit) function. For many common operations, especially in the area of graphics, a CPU needs to change some subset of the bits within a 4 or 8 (or 16 or 32 . . . ) bit word.

It is possible to use a Mask Write function by using separate CAS lines. This would permit one to build memory modules for a computer, such as an IBM (TM) PS/2 that uses only nine x4 DRAMs and takes advantage of some signals on a 72 pin bus to do a Mask Write to a DRAM selected to be a parity DRAM.

This arrangement has the advantage of implementing the parity bits on a single chip rather than mixing the DRAM densities. This requires a separate CAS line for each of the four DQ planes, for the parity information. One would simply drop CAS for the parity bits one wishes to change and leave CAS high for the bits which are not accessed. The advantages to this method are (1) that it works for Page Mode, and (2) makes the decode logic simple. The disadvantage is that it requires a "custom" DRAM with three more pins on it.

Before the Mask Write function was developed, it was necessary for the processor to do a Read-Modify-Write cycle to change individual bits in a x4 or x8 DRAM. The processor must first read all four or eight of the bits from that address location (since it does not know what is stored there) then Modify the bits it wanted to change, and then Write the information back into the memory location.

The Mask Write function speeds up this operation by providing a way to "mask off" the bits that processor does not want to change. The mask data acts as an individual input enable for each of the DQ pins.

In normal Mask Write (also called write-per-bit) cycles the mask data is latched on the falling edge of RAS and cannot be changed in a Page Mode cycle. This invention is a method of latching mask data on the rising edge of CAS so new mask data can be entered in Page Mode.

In the prior art, mask data has always been latched at the falling edge of RAS. This means that the system must exit the Page Mode access cycle in order to enter new mask data, showing the system timing. By latching mask data at the rising edge of CAS, new mask data can be entered without having to exit Page Mode.

SUMMARY OF THE INVENTION

This Invention describes a method of using the Mask Write feature to implement the parity memory on a 256K×36 module. Although this module has a total of 256K×36 bits, it is very desirable for it to be organized as four blocks of 256K×9 bits each, with a RAS line connected to every two blocks and a separate CAS line for every block. Many times, a processor will want to only change some combination of blocks within the 36 bit word. This feature is called "byte addressability". These x36 modules are used in the PS/2 and are both a JEDEC and industry standard product.

The parity bits can not all be put into one 256K×4 part because there must be individual write control on each of the 4 bits, which is not possible when all four bits reside inside one "normal" DRAM. However, if a Mask Write DRAM is used, the mask function can be used to selectively enable the parity bits depending on what combination of the four 9 bit wide blocks are being accessed. For instance, if only Block 1 is being accessed then DQ1 would be enabled and DQ2, DQ3, and DQ4 would be disabled by using the Mask Write on the parity DRAM.

In the case of the module being used strictly as a 32 bit module, the ability to only address one sector on the parity chip is not a significant limitation because all four of the parity bits are accessed on every cycle. Since the parity chip has the capacity to store parity bits on each sector, the parity chip is useful for multiple bytes.

By using the Mask Write function, this module can now be built using only nine DRAMs (instead of twelve) and all of the DRAMs are of the same generation/density. One of the DRAMs (the parity DRAM) would have to be a "Mask Write" version DRAM. Implementing the Mask Write is a simple metal mask option on Micron's 1 Meg and 4 Meg DRAMs, and is a JEDEC optional feature on 4 Meg DRAMs.

During the CAS before RAS cycle, with Write low, the DRAM can be personalized using the address inputs to "tell the chip what it is". The (unused) state is used to "tell the chip whether it is enabled or not", effectively accomplishing selection of the RAM (such as bank switching), a common limitation in AT systems, for example (where there is limited addressing capability).

DETAILED DESCRIPTION OF THE PREFERRED EMBODIMENTS

Figure 1:
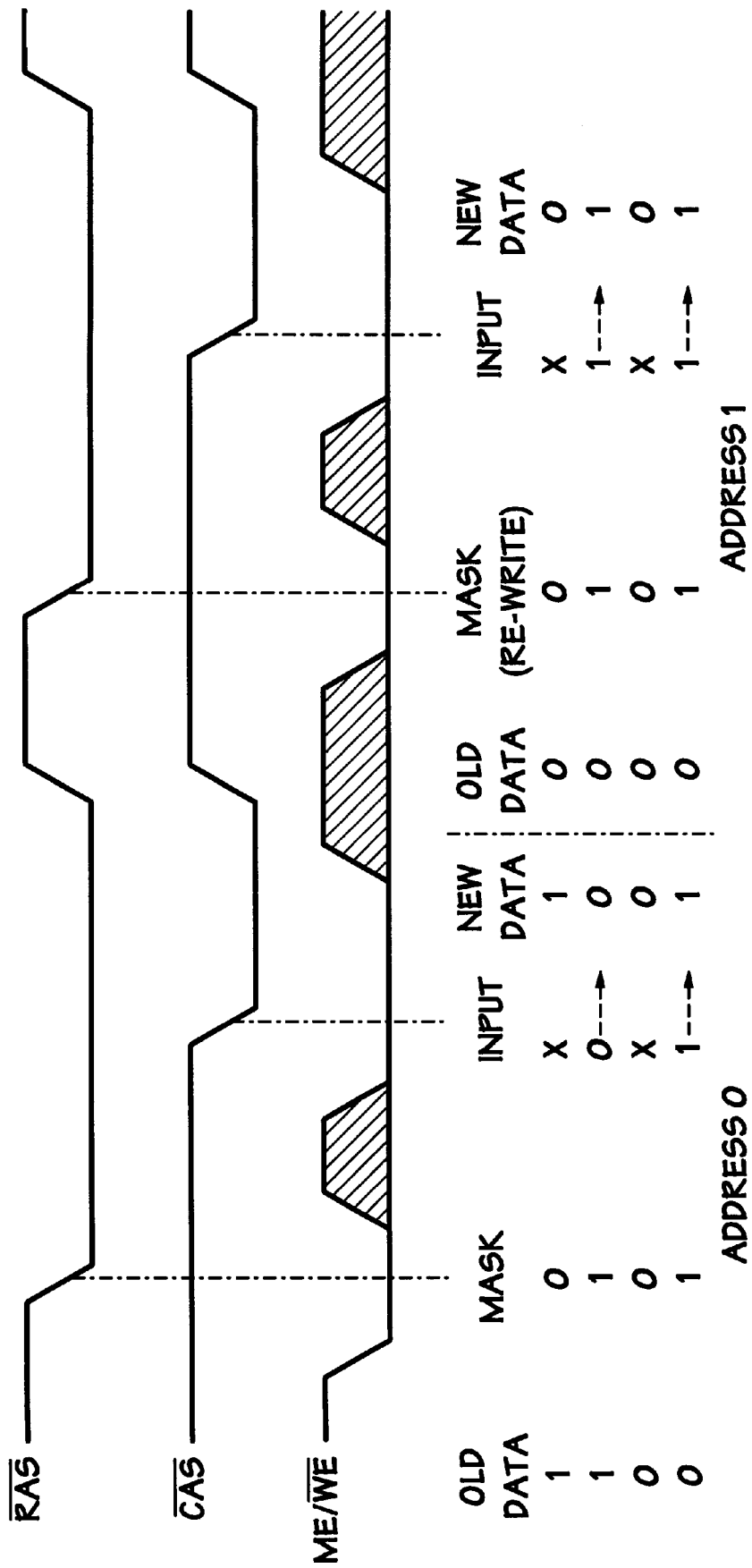
FIG. 1 is a timing diagram of a Mask Write DRAM chip, in which dynamic write to mask is used.
Figure 2:
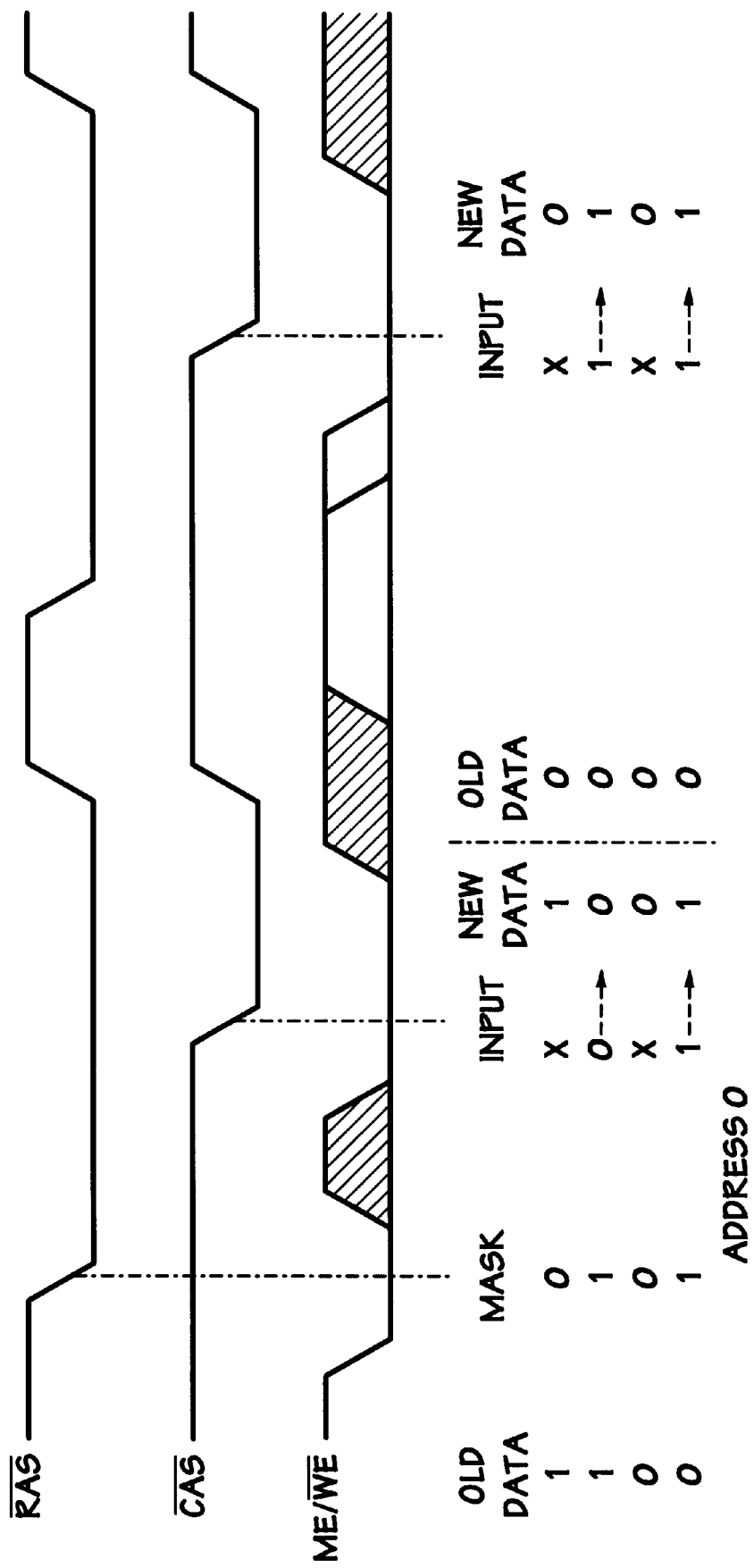
FIG. 2 is a timing diagram of a Mask Write DRAM chip, in which static write to mask is used.

Referring to the timing diagrams of FIGS. 1 and 2, if ME*/WE* is LOW at the RAS HIGH to LOW transition, the data (mask data) present on the data inputs DQ1–DQ4 will be written into a bit mask data register. Each bit of the mask acts as an individual write enable for each of the four DQ1–DQ4 (not shown) pins. This is represented by the first vertical line of both figures. The data inputs DQ1–DQ4 are part of standardized pinout for a memory array circuit, as is known to those skilled in the art of semiconductor design. If a LOW (logic 0) is written to a mask data register input port corresponding to that bit is disabled during the following Write operation and no new data will be written to that DRAM cell location. A HIGH (logic 1) on a mask data register bit enables the input port and allows normal Write operations to proceed. Note that CAS is still HIGH. When CAS goes LOW, the bits present on the DQ1–DQ4 inputs will be either written to the DRAM (if the mask data bit was HIGH) or ignored (if the mask data bit was LOW). The DRAM contents that correspond to the masked bits will not be changed during the Write cycle.

In a dynamic Mask Write chip configuration, new mask data must be supplied for each Mask Write cycle. An example of a typical Mask Write cycle for that configuration is shown in FIG. 1.

The chip described in FIG. 1 also supports RAS only, CAS-before-RAS, and hidden types of refresh cycles. All 256 row address combinations must be accessed within 4 ms. For the CAS-before-RAS refresh mode, the row addresses are generated internally and the user need not supply them as he must in RAS-only refresh. TR/(OE) must be HIGH when RAS goes LOW for the RAS-only and CAS-before-RAS types of refresh cycles. Any Read, Write, or Transfer operation also refreshes the DRAM row that is being accessed.

In a static Mask Write chip configuration, the chip has a static mask feature which eliminates the need to re-write the mask data before each DRAM Write operation. The Mask Write operation for this product is identical to that of the example of FIG. 1. In the present case, every DRAM Write cycle is "masked" by the contents of the mask data register and the contents of the mask data register do not change until another Mask Write operation occurs. For normal DRAM operation, a hex "F" (1111) must be written to the mask data register. A Mask Write cycle for this configuration is shown in FIG. 2.

Figure 3:
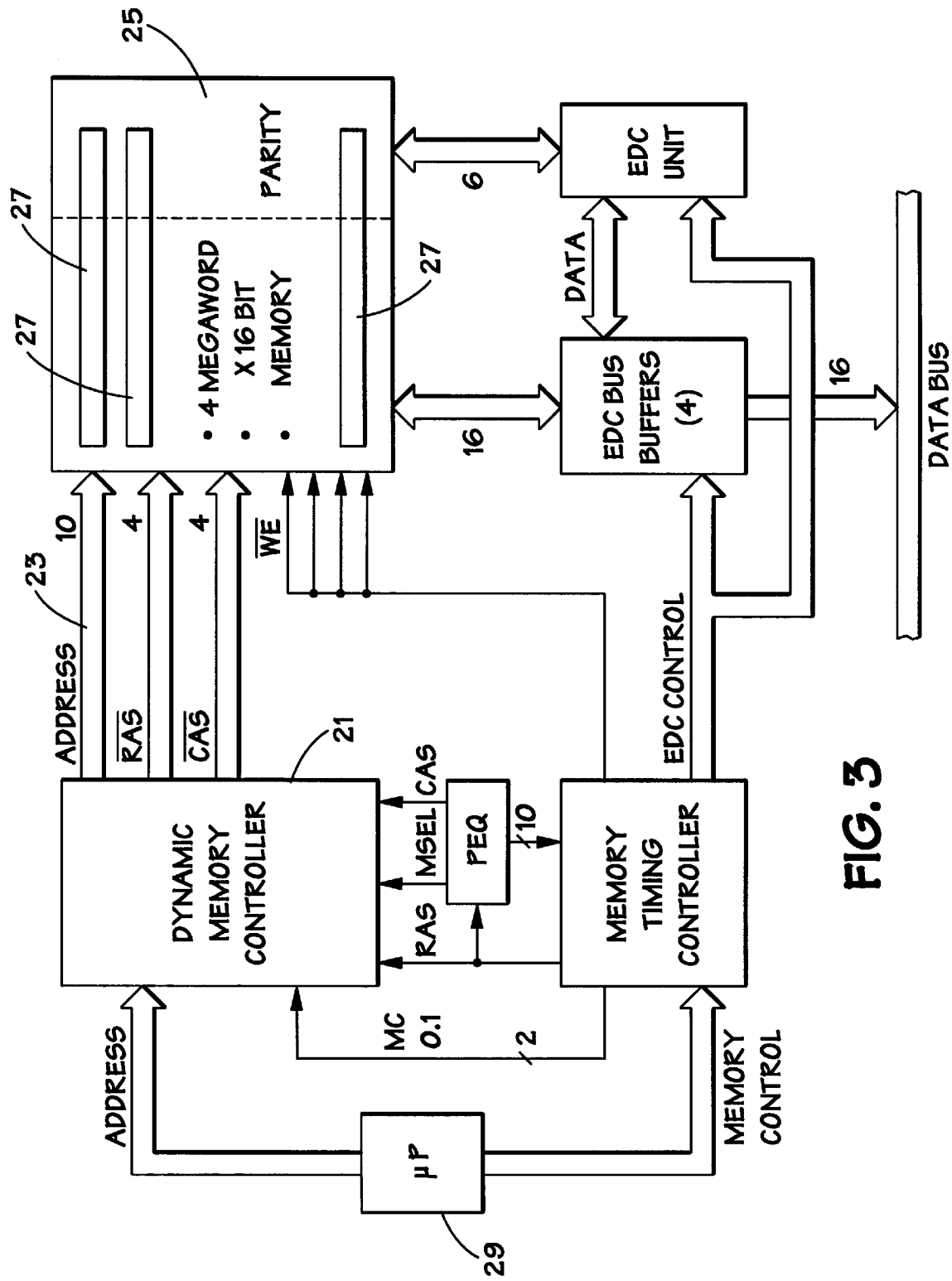
FIG. 3 shows a memory address configuration according to the invention.

FIG. 3 shows an example of the use Mask Write chips in a computer memory. A memory address controller 21 provides signals to an address and control bus 23 and provides an output to a memory array 25. In the preferred embodiment, the memory array 25 is an array of dynamic random access memory (DRAM) modules 27. The address controller 21 includes an address multiplexer, which is internal to the controller 21, and which is controlled by a central processing unit 29, such as an Intel 8086 or Intel 80486 microprocessor or a Motorola 60 series microprocessor. While a separate memory address multiplexer 21 is shown, it is possible to integrate this and other functions into the microprocessor 29. The computer has masked and unmasked modes of operation, whereby the computer addresses bytes of memory having a first plurality of working bits in the masked mode. A further portion of RAM is provided, and the further portion of the RAM has a mask enable feature which permits selectively enabling segments, so that in an unmasked mode, plural segments are addressable, and in masked modes, fewer segments are addressable. The mask enable sequence provides address identity information for portions of DRAM.

The mask enable sequence is effected during a CAS before RAS cycle, with WRITE low, thereby accomplishing selection of the RAM. The mask enable feature is selectively switched on and off by an extra CAS-before-RAS cycle. This is effected during the CAS before RAS cycle, with Write low, thereby accomplishing selection of the RAM. The selective switching by the CAS-before-Write cycle eliminates a need for decoding the CAS signal for selecting the proper bank.

The address multiplexer in the address controller 21 provides the DRAM array 25 with the necessary row, column, and refresh addresses. It is possible to facilitate page mode, wherein the least significant memory addresses are presented as column addresses, and the most significant addresses as row addresses.

There are several different operating modes that can be selected to optimize the operation of the memory system for different computer programs or for different computer memory formats. They range from "page mode" to different numbers of bits per byte.

Figure 4:
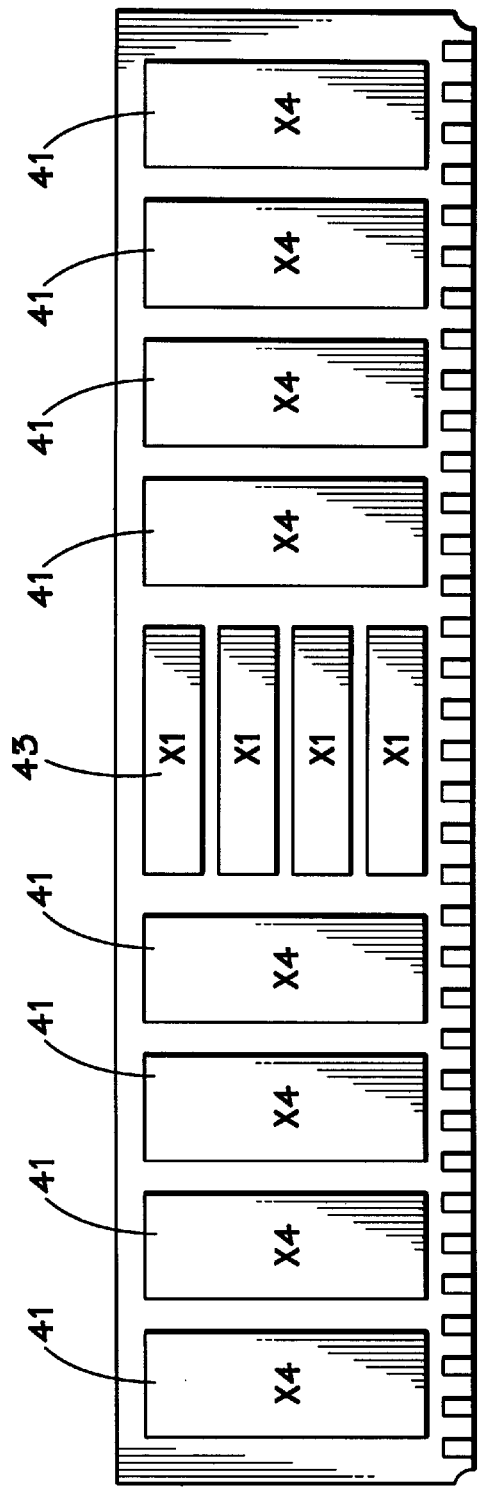
FIG. 4 (prior art) is a block diagram of a RAM chip module which uses different size RAM chips for parity bits and for working data bits.

By using the invention, a nine chip module can be configured which is functionally equivalent to the configuration of FIG. 4. In the "prior art" circuit of FIG. 4, eight "by-four" DRAM chips 41 are grouped together on a memory module, along with four "by-one" DRAM chips 43. The "by-one" chips 43 share the numerical designation of the "by-four" chips 41, and therefore the "by-one" chips each have ¼ the number of bits per DRAM as the "by-four" chips 41 on the same module. For example, eight 1 Meg by-four DRAMs 41 would be combined with four 1 Meg DRAMs 43. The four parity bits are each used to check parity in each of the eight bit bytes defined by the group "by-four" DRAMs 41.

Figure 5:
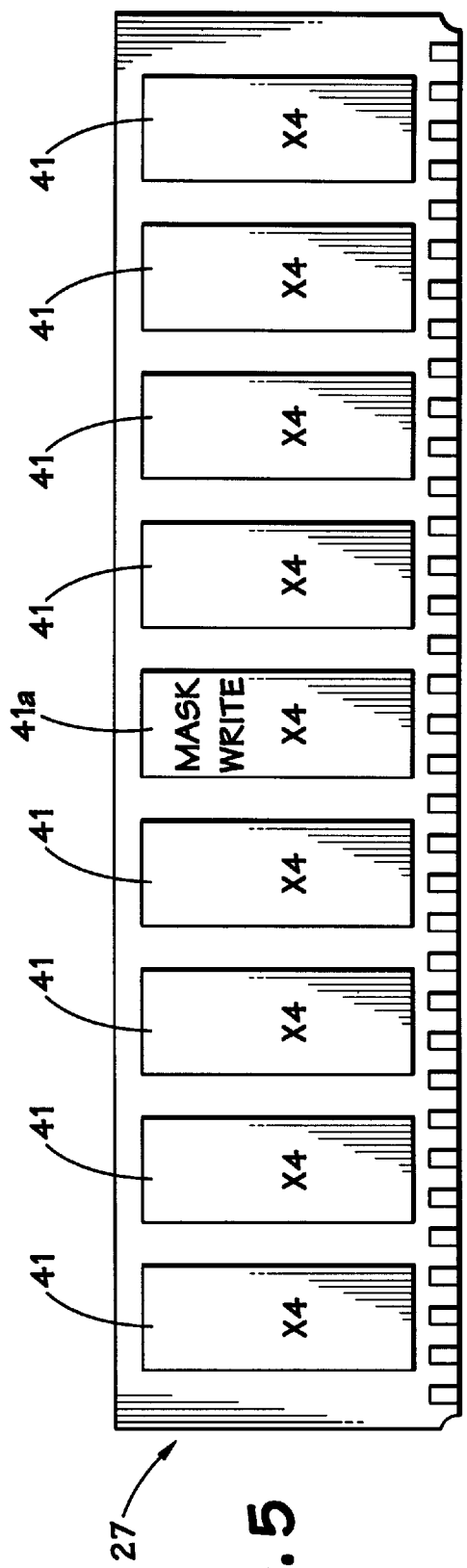
FIG. 5 shows an example of a configuration in which a Mask Write RAM chip is used as a parity for multiple array segments.

FIG. 5 shows the configuration of the present invention, which uses only nine DRAMs 41, 41a (instead of twelve). All of the DRAMs 41, 41a are of the same generation/density. One of the DRAMs 41a (the parity DRAM) would have to be a "Mask Write" version DRAM.

The DRAM array 25 has been described as the random access memory portion of the inventive memory device. It is also possible to use other types of random access memories, such as video RAM (VRAM) or static RAM (SRAM), in lieu of the DRAM 25. Video static RAMs (VSRAMs) are similar to VRAMs, except that, in the VSRAM, the primary memory is configured as SRAM. Likewise, other addressed memory configurations may be used with this invention.

We claim:

1. A memory device comprising:

a memory array comprising a memory module, said memory module comprising a plurality of integrated circuit memory chips, said plurality of integrated circuit memory chips comprising a plurality of data storage chips being configured to store data and a parity storage chip being configured to store parity bits correlative to said data stored in said plurality of data storage chips, said parity storage chip having a mask-write data register, said mask-write data register being configured to store mask data which selectively enables and disables individual columns in said parity storage chip.

2. The memory device, as set forth in claim 1, wherein each of said plurality of data storage chips comprises a memory matrix having 'm' number of rows and 'n' number of columns, and wherein said parity storage chip comprises a memory matrix having 'm' number of rows and 'n' number of columns.

3. The memory device, as set forth in claim 2, wherein 'm' equals 256k and wherein 'n' equals 4.

4. The memory device, as set forth in claim 2, wherein said data storage chips are arranged to form memory blocks having 'm' number of rows and 2 'n' number of columns.

5. The memory device, as set forth in claim 4, comprising a row address strobe line coupled to every two of said memory blocks and a column address strobe line coupled to every one of said memory blocks.

6. The memory device, as set forth in claim 4, wherein said parity bits stored in a respective column of said parity storage chip correspond to data stored in a respective memory block.

7. A memory device comprising:

a memory array comprising a memory module, said memory module comprising a plurality of integrated circuit memory chips, said plurality of integrated circuit memory chips comprising a plurality of data storage chips and a parity storage chip, said parity storage chip having a mask-write data register, said mask-write data register being configured to store mask data which selectively enables and disables individual columns in said parity storage chip; and a processing system being operatively coupled to said memory array, said processing system writing mask data to said mask-write data register, writing data to said data storage chips, and writing parity bits to columns of said parity storage chip enabled by said mask data.

8. The memory device, as set forth in claim 7, wherein each of said plurality of data storage chips comprises a memory matrix having 'm' number of rows and 'n' number of columns, and wherein said parity storage chip comprises a memory matrix having 'm' number of rows and 'n' number of columns.

9. The memory device, as set forth in claim 8, wherein 'm' equals 256k and wherein 'n' equals 4.

10. The memory device, as set forth in claim 8, wherein said data storage chips are arranged to form memory blocks having 'm' number of rows and 2 'n' number of columns.

11. The memory device, as set forth in claim 10, wherein said processing system delivers a row address strobe signal to every two of said memory blocks and a column address strobe signal to every one of said memory blocks.

12. The memory device, as set forth in claim 10, wherein said parity bits stored in a respective column of said parity storage chip correspond to data stored in a respective memory block.

13. The memory device, as set forth in claim 7, wherein said processing system writes mask data to said mask-write data register to selectively enable and disable individual columns of said parity storage chip.

14. The memory device, as set forth in claim 7, wherein said processing system comprises:

a central processing unit delivering memory control signals; and a memory controller operatively coupled to said central processing unit to receive said memory control signals, said memory controller delivering at least one of address signals, data, row address strobe signals, and column address strobe signals to said memory array in response to said memory control signals.

15. A method of operating a memory device, said method comprising the steps of:

(a) providing a memory array comprising a memory module, said memory module comprising a plurality of integrated circuit memory chips, said plurality of integrated circuit memory chips comprising a plurality of data storage chips being configured to store data and a parity storage chip being configured to store parity bits correlative to said data stored in said plurality of data storage chips, said parity storage chip having a mask-write data register, said mask-write data register being configured to store mask data which selectively enables and disables individual columns in said parity storage chip;

(b) storing mask data in said write-mask data register to selectively enable and disable individual columns in said parity storage chip; and (c) storing parity bits in enabled columns of said parity storage chip.

\* \* \* \* \*